United States Patent
He

(10) Patent No.: US 10,991,557 B2
(45) Date of Patent: Apr. 27, 2021

(54) REACTION CHAMBER, DRY ETCHING MACHINE AND ETCHING METHOD

(71) Applicant: HKC Corporation Limited, Guangdong (CN)

(72) Inventor: Huailiang He, Guangdong (CN)

(73) Assignee: HKC Corporation Limited, Shenzhen (CN)

(*) Notice: Subject to any disclaimer, the term of this patent is extended or adjusted under 35 U.S.C. 154(b) by 11 days.

(21) Appl. No.: 16/480,675

(22) PCT Filed: Nov. 13, 2018

(86) PCT No.: PCT/CN2018/115117
§ 371 (c)(1),
(2) Date: Jul. 24, 2019

(87) PCT Pub. No.: WO2020/056890
PCT Pub. Date: Mar. 26, 2020

(65) Prior Publication Data
US 2020/0381220 A1    Dec. 3, 2020

(30) Foreign Application Priority Data
Sep. 18, 2018    (CN) .......................... 201811089014.X

(51) Int. Cl.
| | |
|---|---|
| *H01J 37/32* | (2006.01) |
| *H01L 21/3065* | (2006.01) |
| *H01L 21/308* | (2006.01) |
| *H01L 21/67* | (2006.01) |
| *H01L 21/66* | (2006.01) |

(52) U.S. Cl.
CPC .. *H01J 37/32449* (2013.01); *H01J 37/32082* (2013.01); *H01L 21/308* (2013.01); *H01L 21/3065* (2013.01); *H01L 21/67069* (2013.01); *H01L 21/67253* (2013.01); *H01L 22/26* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,092,032 | A * | 3/1992 | Murakami | ............. H05K 3/243 |
| | | | | 29/830 |
| 6,086,679 | A | 7/2000 | Lee et al. | |
| 2004/0082251 | A1* | 4/2004 | Bach | ...................... C23C 16/52 |
| | | | | 445/60 |
| 2016/0042982 | A1 | 2/2016 | Huang et al. | |

FOREIGN PATENT DOCUMENTS

| | | |
|---|---|---|
| CN | 104073782 A | 10/2014 |
| CN | 104805417 A | 7/2015 |

* cited by examiner

*Primary Examiner* — Bo B Jang

(57) ABSTRACT

Disclosed herein is a reaction chamber comprising a cavity, an upper electrode disposed in the cavity, a gas diffusion plate, and an adjustment assembly, wherein the gas diffusion plate is disposed directly above the upper electrode, and blocks the cavity, and the gas diffusion plate is provided with a plurality of air holes; the adjustment assembly is disposed on the gas diffusion plate.

16 Claims, 3 Drawing Sheets

REACTION CHAMBER, DRY ETCHING MACHINE AND ETCHING METHOD

FIELD

The present application relates to the field of etching equipment, in particular, to a reaction chamber, a dry etching machine and an etching method for improving the uniformity of etching of products.

BACKGROUND

In the preparation process of semiconductor, etching is a process step that chemically or physically removes unwanted material from a silicon or glass substrate selectively, and replicates the final pattern transfer of the desired pattern on a silicon sheet or glass substrate, and can be divided into wet etching and dry etching. Dry etching is a process technology that uses a plasma generated in a gaseous state, through a mask window opened by photolithography, for physical and chemical reactions with silicon wafer or glass substrate exposed to plasma to etch off exposed surface material on silicon sheet or glass substrate. The anisotropy of dry etching can realize the conversion of fine patterns, meet the requirements of smaller and smaller sizes, and has become the most important etching method for sub-micron and below.

However, since there are differences in the shape and density of the etched surface in dry etching, the etching rates for different pattern shapes and densities may be different, resulting in a difference in the depth and critical dimensions of the trenches formed by etching, such as a large area to be etched; then more etchant may be consumed, and when the concentration of the etchant decreases, the etching rate is slowed down, and conversely, the area to be etched is small, and the etching rate is relatively fast. Such phenomenon is called the loading effect. The change of the etch rate caused by the loading effect affects the uniformity of the etch rate and directly affects the overall uniformity of the etch and the quality of the etch.

SUMMARY

The present application provides a reaction chamber, a dry etching machine and an etching method to improve the etching uniformity of the dry etching, reduce the etching load, and improve the etching quality.

To achieve the above purpose, the present application adopts the following technical solutions:

A reaction chamber, comprising a cavity and an upper electrode disposed in the cavity, the reaction chamber further comprising:

a gas diffusion plate disposed directly above the upper electrode, and blocks the cavity; the gas diffusion plate is provided with a plurality of air holes, and is configured to introduce a process gas into the cavity in which the upper electrode is located; and an adjustment assembly disposed on the gas diffusion plate and configured to adjust a ventilation area of each of the air holes.

In an embodiment, the air hole includes a first air hole disposed at a center of the gas diffusion plate and a plurality of second air holes disposed at an edge of the gas diffusion plate, and a plurality of the second air holes are disposed around the first air hole.

In an embodiment, the adjustment assembly includes a plurality of push plates, and each of the push plates is disposed correspondingly on one side of each of the air holes; the gas diffusion plate is provided with a sliding groove, and the push plate may slide along the sliding groove to adjust a corresponding ventilation area of the air hole.

In an embodiment, the reaction chamber further comprises: a drive assembly connected to the adjustment assembly, and configured to drive the adjustment assembly for adjustment; a control assembly connected to the drive assembly, and configured to control the actuation of the drive assembly.

In an embodiment, the control assembly is a computer terminal, and the computer terminal is pre-configured with adjustment parameters disposed to adjust the ventilation area of the air hole under different etching conditions.

In an embodiment, the reaction chamber further comprises a first detection assembly, which is disposed above the gas diffusion plate, connected to the control assembly, and configured to detect a ventilation area of the air hole.

In a still another embodiment, the reaction chamber further comprises a second detection assembly, which is disposed below the upper electrode, connected to the control assembly, and configured to detect an etching rate of the etched area; the control assembly receives a detection information of the detection assembly, and controls the actuation of the drive assembly according to the detection information.

A dry etching device, comprising the above reaction chamber.

An etching method using the above dry etching device and comprising the following steps:

adjusting a ventilation area of the air hole by the adjustment assembly according to an etching pattern;

introducing a process gas into the reaction chamber, the process gas passing through the air hole and being ionized by the upper electrode to form a plasma;

the plasma etching the substrate.

In an embodiment, during the etching of the substrate by the plasma, an etch rate of different portions of the etched pattern is detected, and a ventilation area of the air hole corresponding to the portion is adjusted accordingly.

The reaction chamber provided by the present application may adjust the plasma concentration of a local position in the cavity of the reaction chamber by providing a gas diffusion plate in the cavity and adjusting the ventilation area of the air hole on the gas diffusion plate by using an adjustment assembly, thereby enabling the shape and density of different etched patterns to be correspond to different plasma concentrations, reduce the loading effect of etching and improve the uniformity of the etching rate, and hence improve the uniformity of the etching and the quality of the etching.

The dry etching machine provided by the present application may improve the etching uniformity and etching quality of the product etched by the etching device by using the above reaction chamber.

The etching method provided by the present application may adjust the local concentration of the process gas passing through the air holes by adjusting the ventilation area of the air holes in the gas diffusion plate by using the adjusting assembly, thereby reducing the etching load, and improving uniformity and quality of the etch.

Figure 1:
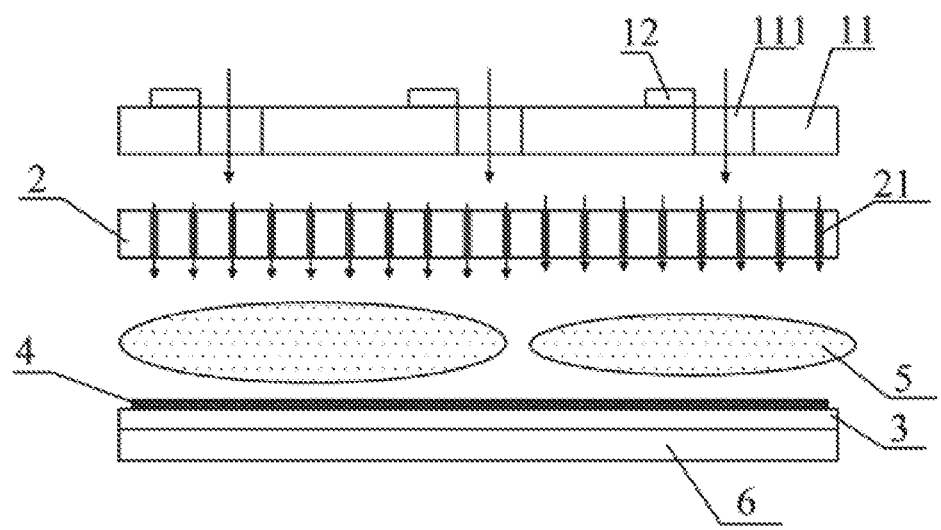
FIG. 1 is a structural view of a reaction chamber provided by the present application.

The reference numerals are as follows:

11—Gas diffusion plate; 111—air hole; 1111—first air hole; 1112—second air hole; 12—adjustment assembly; 121—push plate; 122—slide groove; 2—upper electrode; 21—ionization hole; 3—substrate; 4—mask; 5—plasma; 6—lower electrode; 7—etched pattern; 71—first etched pattern; 72—second etched pattern.

DETAILED DESCRIPTION OF THE EMBODIMENTS

The present application will be further described in detail in combination with drawings and the embodiment. It is to be understood that the specific embodiments described herein are merely illustrative of the present application and are not intended to be limiting. In addition, it should be noted that, for the convenience of description, only some but not all of the structures related to the present application are shown in the drawings.

As shown in FIG. 1, the present application provides a reaction chamber configured for etching comprising a cavity and an upper electrode 2 disposed in the cavity, a lower electrode 6 and a gas diffusion plate 11, wherein the upper electrode 2 is disposed at an upper portion of the reaction chamber, and the lower electrode 6 is disposed at a bottom portion of the reaction chamber and spaced apart from the upper electrode 2; the gas diffusion plate 11 is disposed above the upper electrode 2, and the cavity is partitioned into an air inlet cavity that is configured for a process gas to enter and a reaction cavity that is configured to ionize the process gas and etch the substrate 3; the upper portion of the reaction chamber is provided with an air inlet hole communicating with the air inlet cavity, the air inlet hole being connected to the air supply chamber configured to store the process gases required for etching on the substrate 3, and the process gas enters the air inlet cavity through the air inlet hole, and enters the reaction cavity through the air hole 111 disposed on the gas diffusion plate 11. When the substrate 3 to be etched is placed on the lower electrode 6 and the upper electrode 2 is connected to a RF power source, an electric field is generated between the upper electrode 2 and the lower electrode 6, which may ionizes the process gas of the reaction cavity into a plasma 5; the plasma 5 performs a bombardment etching on the substrate 3 through a mask window opened by photolithography to obtain an etched pattern 7.

In the present embodiment, the gas diffusion plate 11 and the upper electrode 2 are disposed in parallel to reduce the volume of the cavity and the size of the gas diffusion plate 11. In another embodiment, the gas diffusion plate 11 may also be disposed at an angle to the upper electrode 2. In the present embodiment, the reaction chamber has a rectangular parallelepiped as a whole, and may be other suitable shapes; the gas diffusion plate 11 has a shape adapted to the cross section of the reaction chamber cavity. In the present embodiment, the gas diffusion plate 11 is a rectangular parallelepiped structure adapted to the cross section of the reaction chamber cavity, while in another embodiment, the reaction chamber and the gas diffusion plate 11 may have other shapes. The present application does not particularly limit the shape of the reaction chamber and the gas diffusion plate 11.

Figure 2:
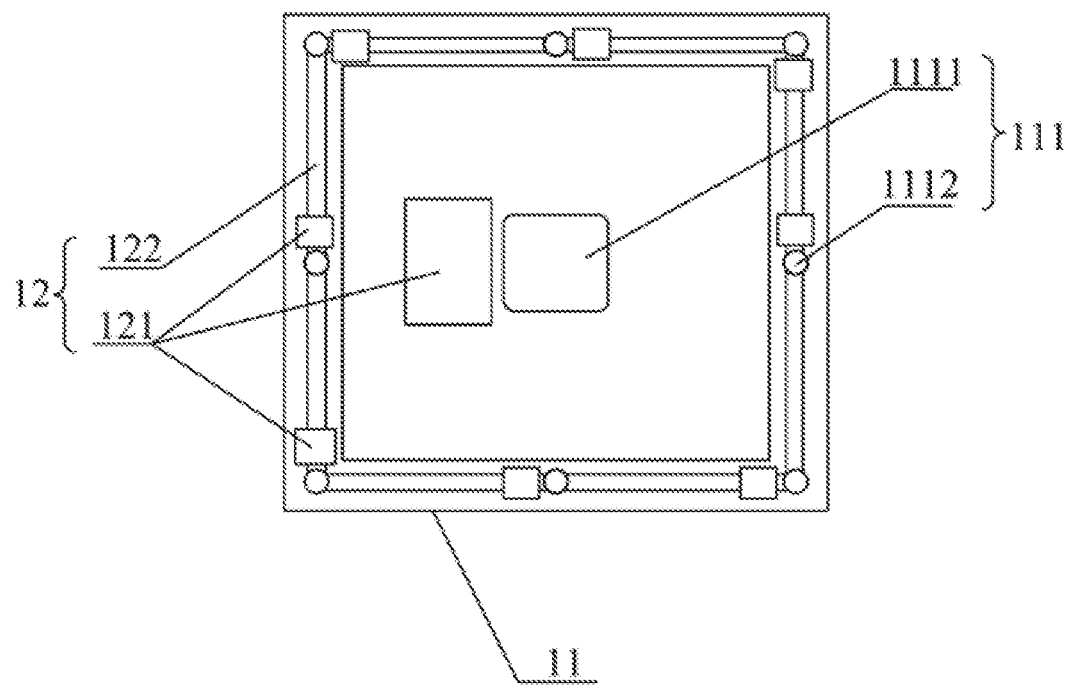
FIG. 2 is a structural view of a gas diffusion plate provided by the present application.

The present embodiment takes a rectangular gas diffusion plate 11 as an example, as shown in FIG. 2, a plurality of air holes 111 are defined in the gas diffusion plate 11, the air hole 111 including a first air hole 1111 disposed at a center of the gas diffusion plate 11 and a plurality of second air holes 1112 disposed at an edge of the gas diffusion plate 11; the plurality of second air holes 1112 are respectively disposed at intermediate positions of the four corners and four sides of the gas diffusion plate 11. The position of the air holes 111 on the gas diffusion plate 11 described above is merely an alternative manner. When the above position of the air hole 111 is used, the ventilation area of the first air hole 1111 at the center of the gas diffusion plate 11 and the ventilation area of the plurality of second air holes 1112 disposed at the edge of the gas diffusion plate 11 may be simultaneously adjusted, thereby enabling a corresponding adjustment for the ventilation area of the first air hole 1111 and/or the ventilation area of the one or several second air holes 1112 upon determining a certain local etching rate to be adjusted according to the size and density of the etched pattern 7 of the substrate 3, so that the adjustment is more targeted and accurate. However, in the present embodiment, the specific number of the air holes 111, the arrangement for specific positions, and the specific shape of the air holes 111 are not particularly limited. On the basis that adjustment may be performed for the ventilation area each of the air holes 111 on the gas diffusion plate 11, the larger the number of the air holes 111 on the gas diffusion plate 11, the better the adjustment effect.

The gas diffusion plate 11 is provided with an adjustment assembly 12 configured to adjust the ventilation area of each of the air holes 111. The adjustment assembly 12 may include a slide groove 122 disposed on the gas diffusion plate 11 and a push plate 121 slidably coupled to the slide groove 122. Among them, the slide groove 122 may be a structure connected to the gas diffusion plate 11 or may be formed by slitting the gas diffusion plate 11. Each of the air holes 111 corresponds to a push plate 121. The push plate 121 may move along the slide groove 122 to partially or completely block the corresponding air holes 111, thereby adjusting the ventilation area of the air holes 111. The adjustment assembly 12 may also be other mechanisms that may achieve the adjustment of the ventilation area of the air holes 111. The present embodiment may not particularly limit the pattern of the adjustment assembly 12.

Figure 3:
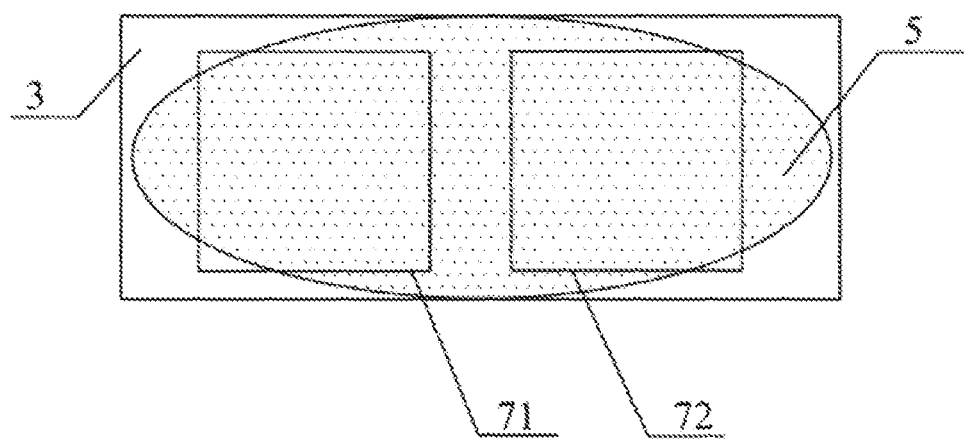
FIG. 3 is state view of an unadjusted plasma when the first etched pattern and the second etched pattern are consistent.
Figure 4:
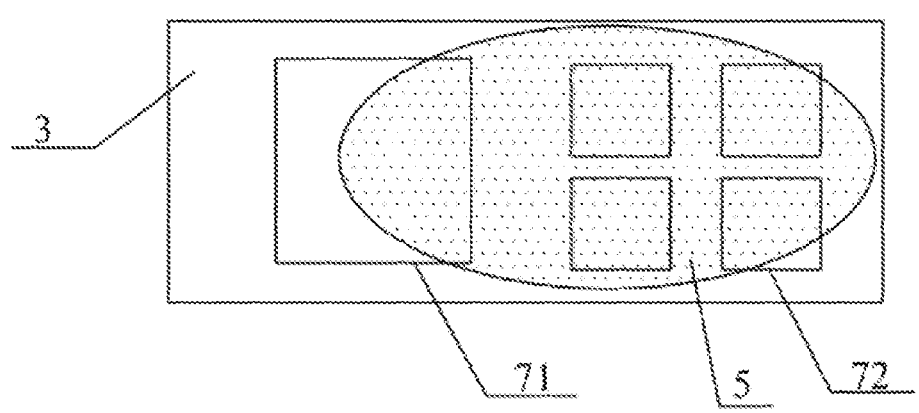
FIG. 4 is state view of an unadjusted plasma when the first etched pattern and the second etched pattern are inconsistent.

Through the adjustment assembly 12, the ventilation area of the corresponding air hole 111 may be adjusted according to the required pattern of the substrate 3 to be etched, so as to reduce the etching loading effect and improve the etching uniformity. For example, when the substrate 3 requires to etch the first etched pattern 71 and the second etched pattern 72, as shown in FIG. 3, if the first etched pattern 71 is the same as the second etched pattern 72, the etching rate uniformity and panel uniformity of both are better even if the ventilation area of the air hole 111 is unadjusted due to the same consumption rate for the plasma 5 by the first etching pattern 71 and the second etching pattern 72. And if the first etched pattern 71 is different from the second etched pattern 72, as shown in FIG. 4, the plasma 5 is consumed more upon the plasma 5 bombarding the mask 4 window formed by the first etched pattern 71 while being consumed less upon the plasma bombarding the mask 4 window formed by the second etched pattern 72 due to the greater etching area of the first etched pattern 71 as compared with the second etched pattern 72, so that the concentration of the plasma 5 at the first etched pattern 71 is lower than the concentration of the plasma 5 at the second etched pattern 72, therefore, the etching rate of the first etched pattern 71 is lower than the etching rate at the second etched pattern 72 to cause a loading effect. Since the etching time of the two etched patterns 7 is the same, the etching depth of the first etched pattern 71 is less than the etching depth of the second etched pattern 72, resulting in poor panel uniformity of the substrate 3.

Figure 5:
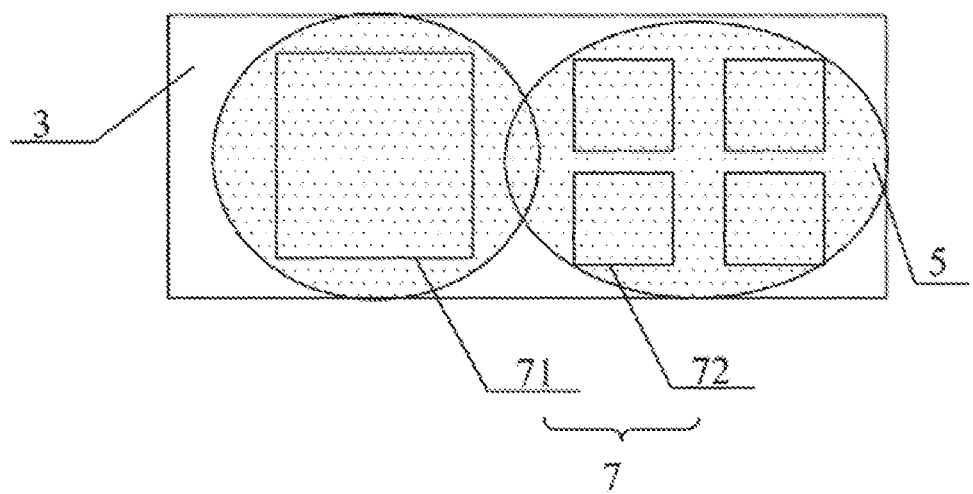
FIG. 5 is state view of an adjusted plasma when the first etched pattern and the second etched pattern are inconsistent.

As shown in FIG. 5, when the adjustment assembly 12 is used to adjust the ventilation area of the air hole 111 on the gas diffusion plate 11, the concentration of the plasma 5 at the first etched pattern 71 may be increased by increasing the ventilation area of the first air hole 1111 and/or the second air hole 1112 corresponding to the first etched pattern 71, or the concentration of the plasma 5 at the second etched pattern 72 may be decreased by decreasing the ventilation area of the first air hole 1111 and/or the second air hole 1112 corresponding to the second etched pattern 72, thereby balancing the etching rates at the first etched pattern 71 and the second etched pattern 72, further improving the loading effect and problem of the panel uniformity and etching quality caused by the loading effect to obtain an etched substrate 3 with better panel uniformity and panel quality.

To improve automation of the adjustment, the reaction chamber further comprises a drive assembly that connects and drives the adjustment assembly 12, and a control assembly that connects and controls the drive assembly. The drive assembly may be a servo motor. When the adjustment assembly 12 adjusts the ventilation area of the air hole 111 in a translational manner, the drive assembly further includes a conversion assembly that converts rotational motion of the servo motor into linear motion of the adjustment assembly 12. The conversion assembly may be a screw nut, a rack and pinion or other structure that may convert the rotational motion into a linear motion. The present embodiment may not limit the structure of the conversion assembly, and likewise, the type of the drive assembly is not particularly limited.

The control assembly may be a computer terminal. The computer terminal may be pre-configured with adjustment parameters for adjusting the ventilation area of the air hole 111 under different etching conditions, or may be manually input in real time with adjustment parameters according to different etching conditions. When the etching condition is changed, the computer may control the drive assembly to perform according to the pre-configured adjustment parameter for this condition or artificially input adjustment parameter, so that the drive assembly drives the adjustment assembly 12 to adjust the ventilation area of the air hole 111.

To improve the automation and real-time of the adjustment, the above reaction chamber further comprises a detection assembly, the detecting assembly including a first detection assembly configured to detect a ventilation area of the air hole 111 and a second detection assembly configured to detect an etching rate of the etched region. The first detection assembly is disposed above the gas diffusion plate 11 and connected to the control assembly, and may detect the ventilation area of each of the air hole 111 on the gas diffusion plate 11 and transmit the signal to the control assembly. The first detection assembly may be an image sensor or other device that may perform the above functions.

The second detection assembly is disposed below the upper electrode 2 and connected to the control assembly, and the second detection assembly may include a thickness detector and a timer. The thickness detector is configured to detect an etching thickness of the etched region for a preset period of time, and the timer is configured to measure the preset time period of time. The thickness detector may be configured to multiple, and to detect the etching thickness of different etching regions of different etching patterns 7, so that the etching rate of different etching regions may be calculated. The control assembly may control the actuation of the drive assembly driving the adjustment assembly 12 in real time according to the etching rate value detected by the second detection assembly, and thus may adjust the ventilation area of the corresponding air hole 111 in view of the local etching rate of the etched pattern 7 in real time.

In the present embodiment, a dry etching machine or a dry etching device comprising the above reaction chamber is also provided. The dry etching machine may comprise other structures or settings necessary for performing dry etching in the existing dry etching device, in addition to the above reaction chamber. The present embodiment may not specifically limit other structures of the dry etching device.

Figure 6:
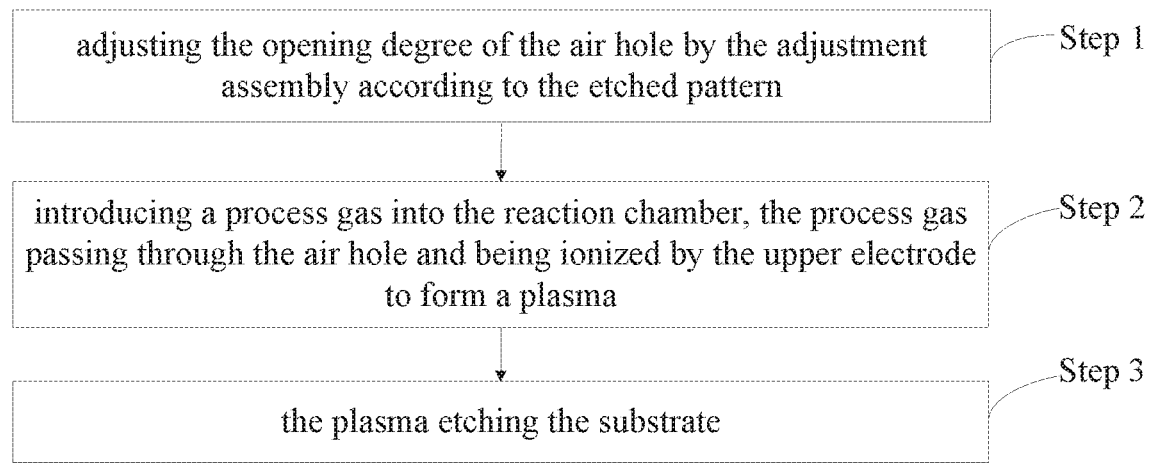
FIG. 6 is a flow chart of an etching method provided by the present application.

In the present embodiment, an etching method configured for the above dry etching machine is also provided, as shown in FIG. 6, the method includes the following steps:

Step 1: adjusting the ventilation area of the air hole 111 by the adjustment assembly 12 according to the etched pattern 7;

the etched pattern 7 is a mask window formed by photolithography of the mask 4 overlying the substrate 3. The actuation of the drive assembly may be controlled based to the pre-configured parameters of the computer terminal according to the etched pattern 7 and the etching condition, thereby driving the adjustment assembly 12 to adjust the ventilation area of the air hole 111; or the adjustment parameters may be artificially input to the computer terminal according to the etched pattern 7 for the adjustment of the ventilation area of the air hole 111.

Step 2: introducing a process gas into the reaction chamber, the process gas passing through the air hole 111 and being ionized by the upper electrode 2 to form a plasma 5;

the substrate 3 to be etched is placed on the lower electrode 6, and the upper electrode 2 is connected to a RF power source to form an electric field between the upper electrode 2 and the lower electrode 6; the gas supply chamber introduces a process gas into the reaction chamber, and the process gas passes through the air holes 111 of the gas diffusion plate 11 and the ionization holes 21 of the upper electrode 2 to enter the electric field region to be ionized to form the plasma 5.

Step 3: the plasma 5 etching the substrate 3;

the plasma 5 bombards the mask window opened by photolithography on the substrate 3 to bombard the etched surface exposed to the plasma 5, thereby achieving the purpose of transferring the etched pattern 7 on the mask 4 onto the substrate 3, that is, the substrate 3 has been etched.

When the substrate 3 is etched; the etching rate of the etched pattern 7 is detected by the second detection assembly, and the detection result is sent to the control system. Then, according to the detection result, when the local rates of the etched pattern 7 are inconsistent, the control system may adjust the ventilation area of the air hole 111 in time, thereby adjusting the etching rate in the etching process in time and improving the uniformity of the etching.

The substrate 3 in the present embodiment may be a multi-model glass substrate, or may be a silicon substrate or the like which may be provided as a dry etching substrate.

The reaction chamber, the dry etching device and the etching method provided in the present embodiment may adjust the local etching rate of the etched pattern 7 through adjusting the ventilation area of the air hole 111 of the gas diffusion plate 11 by using the adjustment assembly 12, thereby improving etching uniformity and improving etching quality; through using the drive assembly, the detection assembly and the control assembly, the adjustment for etching rate may be automated and timely, the etching efficiency is improved, and the etching quality is improved.

Note that the above are only optional embodiments of the present application and the technical principles applied thereto. A person skilled in the art will understand that the present application is not limited to the specific embodiments described herein, and that various changes, modifications and substitutions can be made by those skilled in the art without departing from the scope of the present application. Therefore, although the present application has been described in detail by the above embodiments, the present application is not limited to the above embodiments. Other equivalents may be included without departing from the spirit of the present application, and the scope of the present application is defined by the scope of the appended claims.

The invention claimed is:

1. A reaction chamber, comprising a cavity and an upper electrode disposed in the cavity, wherein the reaction chamber further comprises:
   a gas diffusion plate disposed directly above the upper electrode, and blocks the cavity; the gas diffusion plate is provided with a plurality of air holes, and is configured to introduce a process gas into the cavity in which the upper electrode is located; and
   an adjustment assembly disposed on the gas diffusion plate and configured to adjust a ventilation area of each of the plurality of air holes;
   a drive assembly connected to the adjustment assembly, and configured to drive the adjustment assembly for adjustment; and
   a control assembly connected to the drive assembly, and configured to control an actuation of the drive assembly;
   a first detection assembly, which is disposed above the gas diffusion plate, connected to the control assembly, and configured to detect the ventilation area of each of the plurality of air holes.

2. The reaction chamber according to claim 1, wherein the plurality of air holes includes a first air hole disposed at a center of the gas diffusion plate and a plurality of second air holes disposed at an edge of the gas diffusion plate, and the plurality of the second air holes are disposed around the first air hole.

3. The reaction chamber according to claim 2, wherein the adjustment assembly includes a plurality of push plates, and each of the push plates is disposed correspondingly on one side of each of the plurality of air holes; the gas diffusion plate is provided with a sliding groove, and a push plate of the plurality of push plates slides along the sliding groove to adjust a ventilation area of a corresponding air hole of the plurality of air holes.

4. The reaction chamber according to claim 1, wherein the control assembly is a computer terminal, and the computer terminal is pre-configured with adjustment parameters disposed to adjust the ventilation area of each of the plurality of air holes under different etching conditions.

5. The reaction chamber according to claim 1, wherein the reaction chamber further comprises a second detection assembly, which is disposed below the upper electrode, connected to the control assembly, and configured to detect an etching rate of an etched area;
   the control assembly receives a detection information of the detection assembly, and controls the actuation of the drive assembly according to the detection information.

6. A dry etching machine, wherein the dry etching machine comprises a reaction chamber including a cavity and an upper electrode disposed in the cavity, the reaction chamber further including:
   a gas diffusion plate disposed directly above the upper electrode, and blocks the cavity; the gas diffusion plate is provided with a plurality of air holes, and is configured to introduce a process gas into the cavity in which the upper electrode is located; and
   an adjustment assembly disposed on the gas diffusion plate and configured to adjust a ventilation area of each of the plurality of air holes;
   a drive assembly connected to the adjustment assembly, and configured to drive the adjustment assembly for adjustment; and
   a control assembly connected to the drive assembly, and configured to control an actuation of the drive assembly;
   a first detection assembly, which is disposed above the gas diffusion plate, connected to the control assembly, and configured to detect the ventilation area of each of the plurality of air holes.

7. The dry etching machine according to claim 6, wherein the plurality of air holes includes a first air hole disposed at a center of the gas diffusion plate and a plurality of second air holes disposed at an edge of the gas diffusion plate, and the plurality of the second air holes are disposed around the first air hole.

8. The dry etching machine according to claim 7, wherein the adjustment assembly includes a plurality of push plates, and each of the push plates is disposed correspondingly on one side of each of the plurality of air holes; the gas diffusion plate is provided with a sliding groove, and a push plate of the plurality of push slides along the sliding groove to adjust a ventilation area of a corresponding air hole of the plurality of air holes.

9. The dry etching machine according to claim 7, wherein the control assembly is a computer terminal, and the computer terminal is pre-configured with adjustment parameters disposed to adjust the ventilation area of each of the plurality of air holes under different etching conditions.

10. The dry etching machine according to claim 7, wherein the reaction chamber further comprises a second detection assembly, which is disposed below the upper electrode, connected to the control assembly, and configured to detect an etching rate of an etched area;
    the control assembly receives a detection information of the detection assembly, and controls the actuation of the drive assembly according to the detection information.

11. An etching method, wherein a dry etching machine is used, the dry etching machine comprising a reaction chamber including a cavity and an upper electrode disposed in the cavity, the reaction chamber further including:
    a gas diffusion plate disposed directly above the upper electrode, and blocks the cavity; the gas diffusion plate is provided with a plurality of air holes, and is configured to introduce a process gas into the cavity in which the upper electrode is located; and an adjustment assembly disposed on the gas diffusion plate and configured to adjust a ventilation area of each of the plurality of air holes;
a drive assembly connected to the adjustment assembly, and configured to drive the adjustment assembly for adjustment; and
a control assembly connected to the drive assembly, and configured to control an actuation of the drive assembly;
a first detection assembly, which is disposed above the gas diffusion plate, connected to the control assembly, and configured to detect the ventilation area of each of the plurality of air holes;
the etching method further comprises the following steps:
adjusting the ventilation area of each of the plurality of air holes by the adjustment assembly according to an etching pattern;
introducing the process gas into the reaction chamber, the process gas passing through each of the plurality of air holes and being ionized by the upper electrode to form a plasma;
the plasma etching a substrate.

12. The etching method according to claim 11, wherein during the etching of the substrate by the plasma, an etch rate of different portions of an etched pattern is detected, and a ventilation area of the air hole corresponding to each of the different portions is adjusted accordingly.

13. The etching method according to claim 11, wherein introducing a process gas into the reaction chamber, the process gas passing through each of the plurality of air holes and being ionized by the upper electrode to form a plasma, further includes:
placing the substrate to be etched on a lower electrode, and connecting a RF power source to the upper electrode to form an electric field between the upper electrode and the lower electrode.

14. The etching method according to claim 11, wherein an etched pattern is a mask window formed by photolithography of a mask overlying the substrate.

15. The etching method according to claim 11, wherein the substrate is a multi-model glass substrate.

16. The etching method according to claim 11, wherein the substrate is a silicon substrate.

* * * * *